（12）United States Patent
Yano

(10) Patent No.: US 11,456,743 B2
(45) Date of Patent: Sep. 27, 2022

(54) DIFFERENTIAL SIGNAL TRANSMISSION CIRCUIT

(71) Applicant: Rohm Co., Ltd., Kyoto (JP)

(72) Inventor: Yuji Yano, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/922,466

(22) Filed: Jul. 7, 2020

(65) Prior Publication Data
US 2021/0013884 A1 Jan. 14, 2021

(30) Foreign Application Priority Data

Jul. 9, 2019 (JP) .............................. JP2019127845

(51) Int. Cl.
*H03K 19/0175* (2006.01)
*H03K 19/0185* (2006.01)
*H04L 25/02* (2006.01)
*H01L 27/092* (2006.01)
*H03K 19/017* (2006.01)

(52) U.S. Cl.
CPC ... *H03K 19/018521* (2013.01); *H01L 27/092* (2013.01); *H03K 19/017* (2013.01); *H03K 19/018514* (2013.01); *H03K 19/018564* (2013.01); *H04L 25/02* (2013.01)

(58) Field of Classification Search
CPC .. H03K 19/01; H03K 19/017; H03K 19/0175; H03K 19/017509; H03K 19/01745; H03K 19/0185; H03K 19/018507; H03K 19/018514; H03K 19/018521; H03K 19/018557; H03K 19/018564; H03K 19/018571; H03K 19/018578; H01L 27/092; H04L 25/02; H04L 25/026
See application file for complete search history.

(56) References Cited

U.S. PATENT DOCUMENTS 6,347,047 B2 * 2/2002 Kohno ..................... G11C 7/06
365/104
2001/0040466 A1 * 11/2001 Ide ...................... H04L 25/0274
326/83

(Continued)

FOREIGN PATENT DOCUMENTS

JP 2015-019219 1/2015

*Primary Examiner* — Long Nguyen
(74) *Attorney, Agent, or Firm* — Fish & Richardson P.C.

(57) ABSTRACT

There is provided a differential signal transmission circuit that includes a first output terminal, a second output terminal connected to the first output terminal via a load resistor, a high-side transistor formed of a p-channel MOSFET and connected between an application terminal of a power supply voltage and the first output terminal, a low-side transistor formed of an n-channel MOSFET and connected between an application terminal of a ground potential and the second output terminal, a high-side pre-driver configured to drive the high-side transistor, a low-side pre-driver configured to drive the low-side transistor, a first resistance part connected between an output end of the high-side pre-driver and a gate of the high-side transistor, and a second resistance part connected between an output end of the low-side pre-driver and a gate of the low-side transistor.

7 Claims, 15 Drawing Sheets

(56) References Cited

U.S. PATENT DOCUMENTS

| | | | |
|---|---|---|---|
| 2011/0182369 A1* | 7/2011 | Takarada | H04L 25/0272 375/257 |
| 2015/0162400 A1* | 6/2015 | Yano | H01L 29/1095 257/337 |
| 2016/0155547 A1* | 6/2016 | Yuan | H01C 7/006 338/9 |

* cited by examiner

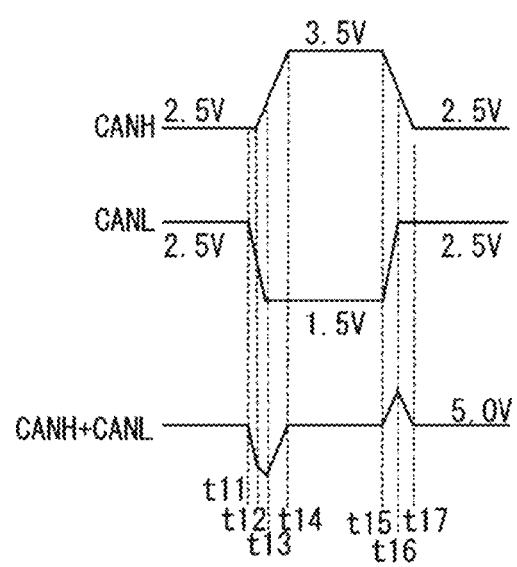

FIG. 6B
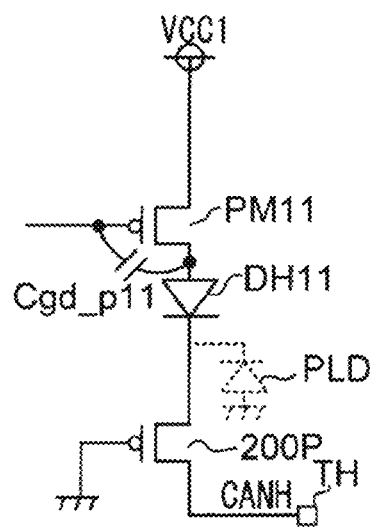
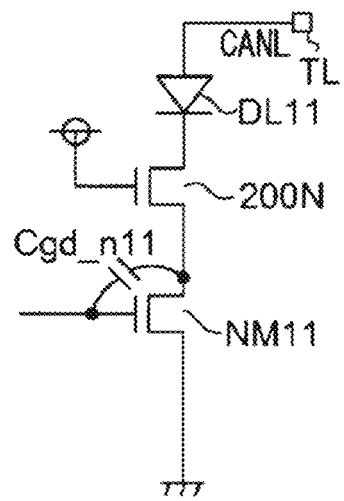

DIFFERENTIAL SIGNAL TRANSMISSION CIRCUIT

CROSS-REFERENCE TO RELATED APPLICATION(S)

This application is based upon and claims the benefit of priority from Japanese Patent Application No. 2019-127845, filed on Jul. 9, 2019, the entire contents of which are incorporated herein by reference.

TECHNICAL FIELD

The present disclosure relates to a differential signal transmission circuit.

BACKGROUND

For example, a 2-wire differential signal system such as a controller area network (CAN) or FlexRay or a bus system, which is referred to as a differential transmission circuit, is known as an in-vehicle network. Further, FlexRay is developed as a next-generation standard for CAN. The CAN is standardized by the international standard ISO 11898 or the like.

The CAN is disclosed in the related art.

In an in-vehicle device, it is particularly required to suppress the influence of external noise on the device and to suppress noise generated by the device itself. Therefore, a circuit design is required to take into account electromagnetic compatibility (EMC). EMC measures are also important in the CAN and FlexRay.

SUMMARY

Some embodiments of the present disclosure provide a differential signal transmission circuit capable of suppressing generation of electromagnetic interference (EMI) noise.

According to one embodiment of the present disclosure, there is provided a differential signal transmission circuit that includes:
a first output terminal;
a second output terminal connected to the first output terminal via a load resistor;
a high-side transistor formed of a p-channel MOSFET and connected between an application terminal of a power supply voltage and the first output terminal;
a low-side transistor formed of an n-channel MOSFET and connected between an application terminal of a ground potential and the second output terminal;
a high-side pre-driver configured to drive the high-side transistor;
a low-side pre-driver configured to drive the low-side transistor;
a first resistance part connected between an output end of the high-side pre-driver and a gate of the high-side transistor; and
a second resistance part connected between an output end of the low-side pre-driver and a gate of the low-side transistor (first configuration).

According to the first configuration, the first resistance part and the second resistance part are devices having a same composition (second configuration).

According to the second configuration, the first resistance part and the second resistance part are polysilicon resistors (third configuration).

According to the first configuration, each of the first resistance part and the second resistance part has a configuration in which a resistor having a negative temperature characteristic for resistance values and a resistor having a positive temperature characteristic for the resistance values are connected in series (fourth configuration).

According to any one of the first to fourth configurations, the following conditions are satisfied:

$$RP \cdot C_{gd\_p} \approx RN \cdot C_{gd\_n}$$

where RP is a resistance value of the first resistance part, RN is a resistance value of the second resistance part, $C_{gd\_p}$ is gate-drain capacitance of the high-side transistor, and $C_{gd\_n}$ is gate-drain capacitance of the low-side transistor (fifth configuration).

According to any one of first to fifth configurations, the differential signal transmission circuit further includes a high-side resistor connected between the application terminal of the power supply voltage and the high-side transistor; and a low-side resistor connected between the application terminal of the ground potential and the low-side transistor,
wherein a second power supply voltage can be applied to the first output terminal and the second output terminal, and each of the high-side pre-driver and the low-side pre-driver has a CMOS configuration (sixth configuration).

According to any one of first to fifth configurations, a second power supply voltage can be applied to the first output terminal and the second output terminal,
wherein the high-side pre-driver includes:
a first p-channel MOSFET constituting a current mirror with the high-side transistor;
a second p-channel MOSFET connected between a gate of the first p-channel MOSFET and a gate of the high-side transistor; and
a third p-channel MOSFET having a gate to which an inverted signal of a signal applied to a gate of the second p-channel MOSFET is applied, and connected between an application terminal of a third power supply voltage and a first connection node to which the second p-channel MOSFET and the first resistance part are connected, and wherein the low-side pre-driver includes:
a first n-channel MOSFET constituting a current mirror with the low-side transistor;
a second n-channel MOSFET connected between a gate of the first n-channel MOSFET and a gate of the low-side transistor; and
a third n-channel MOSFET having a gate to which an inverted signal of a signal applied to a gate of the second n-channel MOSFET is applied, and connected between the application terminal of the ground potential and a second connection node at which the second n-channel MOSFET and the second resistance part are connected to each other (seventh configuration).

According to another embodiment, there is provided a differential signal transmission circuit that includes a plurality of stages, each having the sixth configuration as one stage,
wherein an output end of either the high-side pre-driver or the low-side pre-driver on a front stage side of adjacent stages is connected to an input end of each of the high-side pre-driver and the low-side pre-driver on a rear stage side of the adjacent stages (eighth configuration).

According to another embodiment, there is provided a controller area network (CAN) transceiver including the differential signal transmission circuit of any one of the first to eighth configurations.

According to another embodiment, there is provided a low voltage differential signaling (VLDS) system including the differential signal transmission circuit of any one of the first to eighth configurations.

According to another embodiment, there is provided a differential signal transmission circuit that includes:
a first output terminal;
a second output terminal connected to the first output terminal via a load resistor;
a high-side transistor formed of a p-channel MOSFET and connected between an application terminal of a power supply voltage and the first output terminal;
a low-side transistor formed of an n-channel MOSFET and connected between an application terminal of a ground potential and the second output terminal and;
a high-side pre-driver configured to drive the high-side transistor; and
a low-side pre-driver configured to drive the low-side transistor,
wherein the high-side pre-driver includes:
a first p-channel MOSFET;
a first n-channel MOSFET having a drain connected to a drain of the first p-channel MOSFET;
a first constant current source arranged between the application terminal of the power supply voltage and a source of the first p-channel MOSFET; and
a second constant current source arranged between the application terminal of the ground potential and a source of the first n-channel MOSFET, and
wherein the low-side pre-driver includes:
a second p-channel MOSFET;
a second n-channel MOSFET having a drain connected to a drain of the second p-channel MOSFET;
a third constant current source arranged between the application terminal of the power supply voltage and a source of the second p-channel MOSFET; and
a fourth constant current source arranged between the application terminal of the ground potential and a source of the second n-channel MOSFET.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a timing chart illustrating an example of behavior of non-ideal high-side signal CANH and low-side signal CANL.

FIG. 6B is a circuit diagram illustrating a modified example of FIG. 6A.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An embodiment of the present disclosure will now be described with reference to the drawings.

1. Configuration of can

Figure 1:
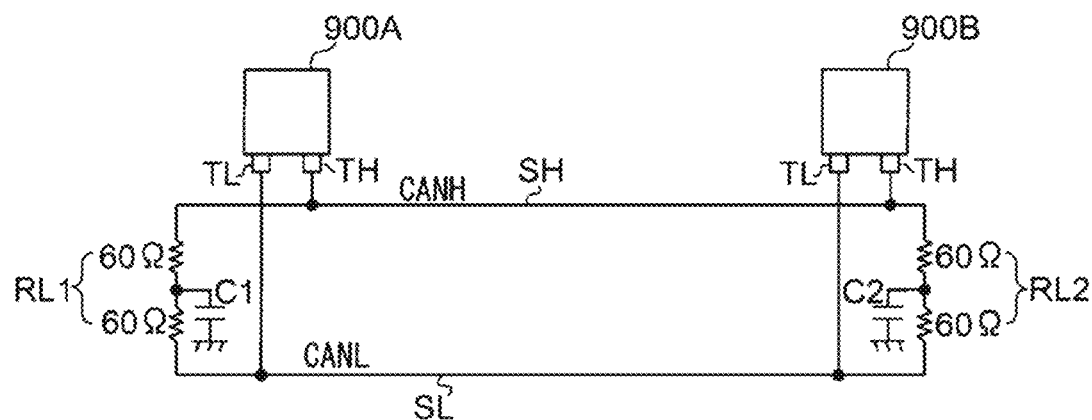
FIG. 1 is a configuration diagram illustrating an example of a CAN.

FIG. 1 is a configuration diagram illustrating an example of a CAN. A CAN 900 illustrated in FIG. 1 includes a CAN transceiver IC 900A, a CAN transceiver IC 900B, a first bus line SH, and a second bus line SL. The CAN transceiver ICs 900A and 900B are both capable of transmission and reception in CAN communication.

Each of the CAN transceiver ICs 900A and 900B includes a differential signal transmission circuit (not shown) as described hereinbelow, a high-side output terminal TH, and a low-side output terminal TL. During data transmission, a high-side signal CANH is output from the high-side output terminal TH to the first bus line SH by the differential signal transmission circuit, and a low-side signal CANL is output from the low-side output terminal TL to the second bus line SL by the differential signal transmission circuit. A CAN signal is output as a differential signal between the high-side signal CANH and the low-side signal CANL.

One end of the first bus line SH and one end of the second bus line SL are connected by a termination resistor RL1. The other end of the first bus line SH and the other end of the second bus line SL are connected by a termination resistor RL2. Resistance values of the termination resistors are defined as 120Ω by ISO 11898, and each of the termination resistors RL1 and RL2 is formed by connecting 60Ω resistors in series. Further, one end of each of capacitors C1 and C2 is connected to a connection node at which the resistors of 60Ω are connected to each other.

2. Comparative Examples and their Problems

Before describing embodiments of the present disclosure, configurations of differential signal transmission circuits according to comparative examples, and their problems will be described first.

Figure 2:
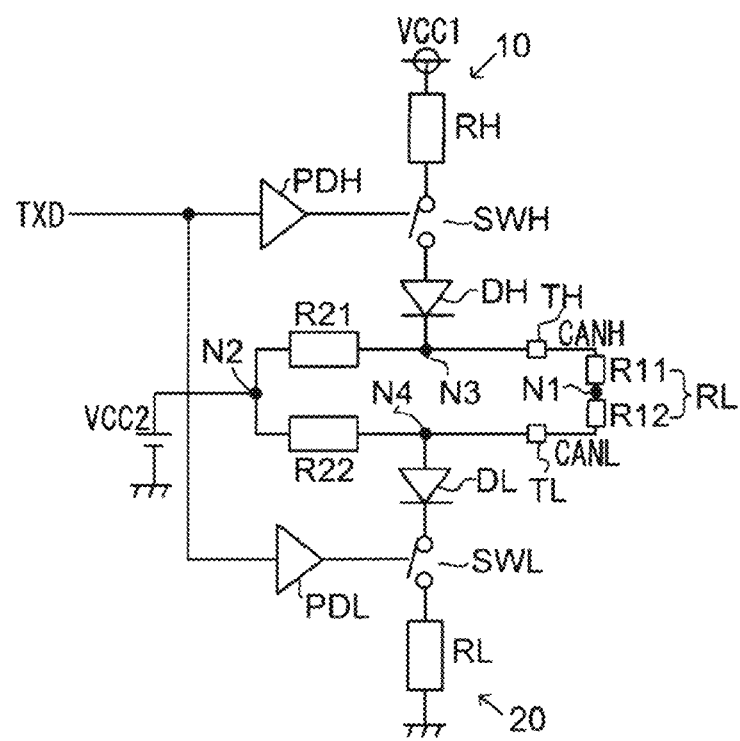
FIG. 2 is a circuit diagram illustrating a configuration of a differential signal transmission circuit according to a first comparative example.

FIG. 2 is a circuit diagram illustrating a configuration of a differential signal transmission circuit 100 according to a first comparative example. As illustrated in FIG. 2, the differential signal transmission circuit 100 includes a high-side output part 10, a low-side output part 20, a resistor R21, a resistor R22, a high-side output terminal TH, and a low-side output terminal TL.

The high-side output part 10 includes a high-side resistor RH, a high-side switch SWH, a high-side diode DH, and a high-side pre-driver PDH. The high-side resistor RH is implemented by, for example, on-resistance of a MOSFET, but a bipolar transistor or a resistor may also be used. One end of the high-side resistor RH is connected to an application terminal of a first power supply voltage VCC1. The other end of the high-side resistor RH is connected to one end of the high-side switch SWH. The other end of the high-side switch SWH is connected to an anode of the high-side diode DH. A cathode of the high-side diode DH is connected to a connection node N3 at which one end of the resistor R21 and the high-side output terminal TH are connected to each other. The high-side pre-driver PDH switches ON/OFF of the high-side switch SWH according to an input signal TXD.

The low-side output part 20 includes a low-side resistor RL, a low-side switch SWL, a low-side diode DL, and a low-side pre-driver PDL. The low-side resistor RL is implemented by, for example, on-resistance of a MOSFET, but a bipolar transistor or a resistor may also be used. One end of the low-side resistor RL is connected to an application terminal of a ground potential. The other end of the low-side resistor RL is connected to one end of the low-side switch SWL. The other end of the low-side switch SWL is connected to a cathode of the low-side diode DL. An anode of the low-side diode DL is connected to a connection node N4 at which one end of the resistor R22 and the low-side output terminal TL are connected to each other. The low-side pre-driver PDL switches ON/OFF of the low-side switch SWL according to the input signal TXD.

The other end of the resistor R21 and the other end of the resistor R22 are connected to each other at a connection node N2. An application terminal of a second power supply voltage VCC2 is connected to the connection node N2.

In addition, as illustrated in FIG. 2, a load resistor RL is connected between the high-side output terminal TH and the low-side output terminal TL. The load resistor RL corresponds to a combined resistance of termination resistors RL1 and RL2 connected in parallel in FIG. 1 described above. That is, since the termination resistors RL1 and RL2 are each 120Ω, the load resistor RL becomes 60Ω. Further, as illustrated in FIG. 2, the load resistor RL is represented by a high-side load resistor R11 and a low-side load resistor R12 connected in series at a connection node N1, as an equivalent circuit with the circuit illustrated in FIG. 1, and resistance values of the load resistors R11 and R12 each become 30Ω.

Further, the resistors R21 and R22 have the same resistance value, which is sufficiently higher than the load resistors R11 and R12, and are set to, for example, 15 kΩ.

When both the high-side switch SWH and the low-side switch SWL are turned on, a current sequentially flows through the high-side resistor RH, the high-side switch SWH, the high-side diode DH, the high-side output terminal TH, the load resistor R11, the load resistor R12, the low-side output terminal TL, the low-side diode DL, the low-side switch SWL, and the low-side resistor RL. At this time, in order to make a voltage applied to the connection node N1 equal to an intermediate voltage between the first power supply voltage VCC1 and the ground potential, the resistance values of the high-side resistor RH and the low-side resistor RL are set to be substantially equal to each other, and forward voltages (Vf) of the high-side diode DH and the low-side diode DL are also set to be substantially equal to each other.

In addition, the high-side diode DH is installed to prevent a current from flowing backward from the connection node N3 toward the application terminal of the first power supply voltage VCC1 when a positive surge voltage is generated at the high-side output terminal TH. Similarly, the low-side diode DL is installed to prevent a current from flowing backward from the application terminal of the ground potential toward the connection node N4 when a negative surge voltage is generated at the low-side output terminal TL.

More specifically, the power supply voltage VCC1 is set to 5 V, and the connection node N1 is set to 2.5 V which is the intermediate voltage. Further, since the current flowing through the load resistors R11 and R12 is common, voltage drops respectively generated in the load resistors R11 and R12 are equal to each other, and the high-side signal CANH generated at the high-side output terminal TH becomes a voltage higher than a voltage (=intermediate voltage) of the connection node N1 by the voltage drop, and the low-side signal CANL generated at the low-side output terminal TL becomes a voltage lower than a voltage (=intermediate voltage) of the connection node N1 by the voltage drop.

More specifically, 3.5 V, which is a voltage higher than the intermediate voltage=2.5 V by a voltage drop of 1 V, is set as the high-side signal CANH, and 1.5 V, which is a voltage lower than the intermediate voltage=2.5 V by a voltage drop of 1 V, is set as the low-side signal CANL. Furthermore, 3.5 V is a high level of the high-side signal CANH defined in the CAN, and 1.5 V is a low level of the low-side signal CANL defined in the CAN.

Further, when both the high-side switch SWH and the low-side switch SWL are turned off, the voltage of the connection node N1 may gradually approach the second power supply voltage VCC2 by the action of the resistors R21 and R22 having relatively high resistance values. The second power supply voltage VCC2 is set to 2.5 V. This 2.5 V is the low level of the high-side signal CANH and the high level of the low-side signal CANL defined in the CAN, which is a voltage equal to the intermediate voltage.

In addition, the voltage of the connection node N1 is stabilized by the capacitors C1 and C2 illustrated in FIG. 1.

With this configuration, when the input signal TXD is at a low level, both the high-side switch SWH and the low-side switch SWL are turned on by the high-side pre-driver PDH and the low-side pre-driver PDL, and the high-side signal CANH becomes 3.5 V and the low-side signal CANL becomes 1.5 V. At this time, it corresponds to a dominant state. On the other hand, when the input signal TXD is at a high level, both the high-side switch SWH and the low-side switch SWL are turned off by the high-side pre-driver PDH and the low-side pre-driver PDL, and both the high-side signal CANH and the low-side signal CANL become 2.5 V. At this time, it corresponds to a recessive state. Accordingly, a sum of the high-side signal CANH and the low-side signal CANL at the low level and the high level of the input signal TXD becomes constant at 5 V. Thus, it is possible to suppress the generation of EMI noise (common mode noise).

Figure 3A:
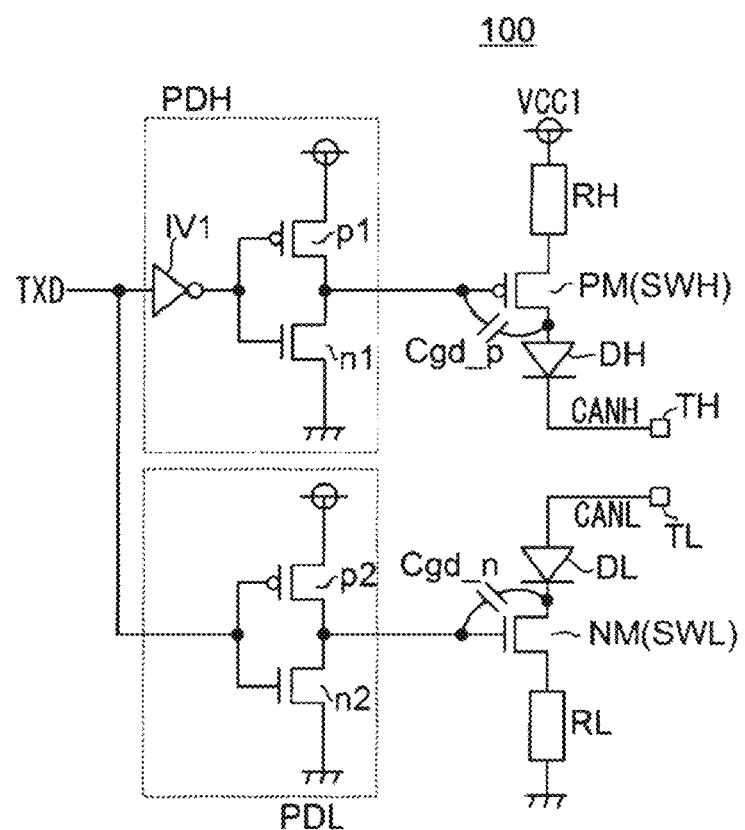
FIG. 3A is a circuit diagram illustrating a more specific configuration of the differential signal transmission circuit illustrated in FIG. 2.

FIG. 3A is a circuit diagram illustrating a more specific configuration of the differential signal transmission circuit 100 illustrated in FIG. 2. The illustration of the resistors R21 and R22 and the load resistor RL is omitted in FIG. 3A.

As illustrated in FIG. 3A, the high-side pre-driver PDH has an inverter IV1, a high-side transistor p1 formed of a p-channel MOSFET, and a low-side transistor n1 formed of an re-channel MOSFET. A CMOS is configured by the high-side transistor p1 and the low-side transistor n1. An output end of the inverter IV1 is connected to a node at which a gate of the high-side transistor p1 and a gate of the low-side transistor n1 are connected to each other. The input signal TXD is input to an input end of the inverter IV1. Further, in FIG. 3A, the high-side switch SWH is a high-side transistor PM formed of a p-channel MOSFET, and a node at which a drain of the high-side transistor p1 and a drain of the low-side transistor n1 are connected to each other is connected to a gate of the high-side transistor PM.

In addition, as illustrated in FIG. 3A, the low-side pre-driver PDL has a high-side transistor p2 formed of a p-channel MOSFET and a low-side transistor n2 formed of an re-channel MOSFET. A CMOS is configured by the high-side transistor p2 and the low-side transistor n2. The input signal TXD is applied to a node at which a gate of the high-side transistor p2 and a gate of the low-side transistor n2 are connected to each other. Further, in FIG. 3A, the low-side switch SWL is a low-side transistor NM formed of an n-channel MOSFET, and a node at which a drain of the high-side transistor p2 and a drain of the low-side transistor n2 are connected to each other is connected to a gate of the low-side transistor NM.

With this configuration illustrated in FIG. 3A, when the input signal TXD is at a low level, the low-side transistor n1 is turned on, the high-side transistor PM is turned on, the high-side transistor p2 is turned on, and the low-side transistor NM is turned on. Therefore, as described above, the high-side signal CANH becomes 3.5 V and the low-side signal CANL becomes 1.5 V. On the other hand, when the input signal TXD is at a high level, the high-side transistor p1 is turned on, the high-side transistor PM is turned off, the low-side transistor n2 is turned on, and the low-side transistor NM is turned off. Therefore, as described above, both the high-side signal CANH and the low-side signal CANL become 2.5 V.

Figure 3B:
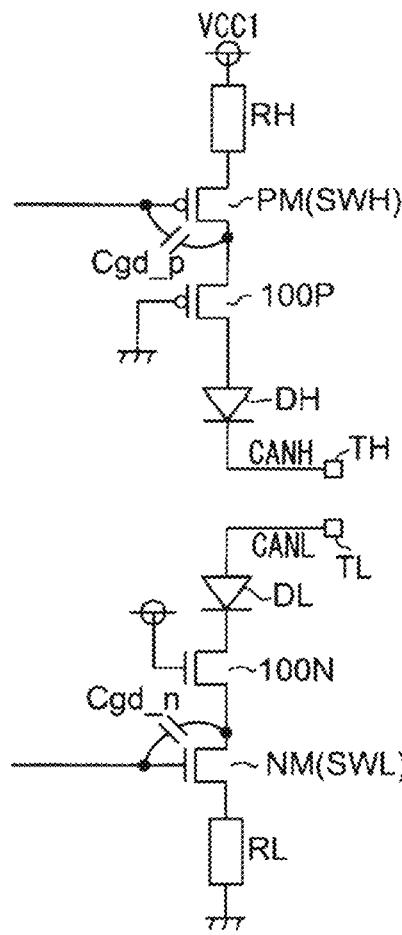
FIG. 3B is a circuit diagram illustrating a modified example of FIG. 3A.

In addition, there is a possibility that a surge of ±several tens of V may be input from the outside to the high-side output terminal TH and the low-side output terminal TL. In consideration of this, it is desirable to install a high breakdown voltage PMOS (p-channel MOSFET) 100P and a high breakdown voltage NMOS (n-channel MOSFET) 100N, as illustrated in FIG. 3B. In FIG. 3B, more specifically, a source of the PMOS 100P is connected to a drain of the high-side transistor PM, a drain of the PMOS 100P is connected to an anode of the high-side diode DH, and the application terminal of the ground potential is connected to a gate of the PMOS 100P. By doing so, it is possible to clamp Vds (drain-source voltage) of the high-side transistor PM having a low breakdown voltage. Further, a source of the NMOS 100N is connected to a drain of the low-side transistor NM, a drain of the NMOS 100N is connected to a cathode of the low-side diode DL, and the application terminal of the power supply voltage is connected to a gate of the NMOS 100N. By doing so, it is possible to clamp Vds of the low-side transistor NM having a low breakdown voltage.

Figure 4:
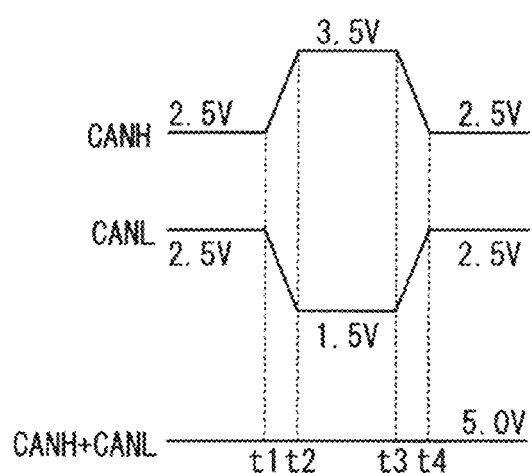
FIG. 4 is a timing chart illustrating an example of behavior of ideal high-side signal CANH and low-side signal CANL.

FIG. 4 is a timing chart illustrating behavior of an ideal high-side signal CANH and an ideal low-side signal CANL. In FIG. 4, since the input signal TXD is at a high level, both the high-side transistor PM and the low-side transistor NM are tuned off, and when the input signal TXD is switched to a low level from a state in which both the high-side signal CANH and the low-side signal CANL are 2.5 V, the high-side transistor PM and the low-side transistor NM are turned on at the same timing t1. Then, in a turn-on period of timings t1 to t2, a slew rate of the high-side signal CANH (=dCANH/dt) matches a slew rate of the low-side signal CANL (=dCANL/dt).

Thereafter, when the input signal TXD is switched to a high level, the high-side transistor PM and the low-side transistor NM are turned off at the same timing t3. Then, in a turn-off period of timings t3 to t4, a slew rate of the high-side signal CANH matches a slew rate of the low-side signal CANL.

As illustrated in FIG. 4, a sum of the high-side signal CANH and the low-side signal CANL becomes constant at 5V due to such ideal behavior. Thus, it is possible to suppress the generation of EMI noise.

However, the ideal behavior described above is not obtained unless circuit constants are properly set. An example of this case is illustrated in FIG. 5. In FIG. 5, the turn-on timings of the low-side signal CANL and the high-side signal CANH are deviated from each other as t11 and t12. Furthermore, a slew rate in a turn-on period (t12 to t14) of the high-side signal CANH does not match a slew rate in a turn-on period (t11 to t13) of the low-side signal CANL.

In addition, in FIG. 5, a slew rate in a turn-off period (t15 to t17) of the high-side signal CANH does not match a slew rate in a turn-off period (t15 to t16) of the low-side signal CANL.

As illustrated in FIG. 5, such behavior causes a fluctuation in a sum of the high-side signal CANH and the low-side signal CANL, which causes the generation of EMI noise.

Therefore, in order to match the switching timings and the slew rates between the high-side signal CANH and the low-side signal CANL, it is necessary to set the circuit constants that satisfy the conditions below in the circuit illustrated in FIG. 3A. However, it is assumed that the high-side transistor PM and the low-side transistor NM have substantially the same threshold voltage Vth of Vgs.

If the input signal TXD is at a low level:
$Ron\_n1 \cdot Cgd\_p \approx Ron\_p2 \cdot Cgd\_n$ If the input signal TXD is at a high level:
$Ron\_p1 \cdot Cgd\_p \approx Ron\_n2 \cdot Cgd\_n$     <Condition 1> where Ron_n1 is on-resistance of the low-side transistor n1, Ron_p1 is on-resistance of the high-side transistor p1, Ron_n2 is on-resistance of the low-side transistor n2, Ron_p2 is on-resistance of the high-side transistor p2, Cgd_p is gate-drain capacitance of the high-side transistor PM, and Cgd_n is gate-drain capacitance of the low-side transistor NM (however, it is assumed that gm (=ΔId/ΔVgs) of PN and MM having a Miller effect is substantially equal to each other).

Figure 6A:
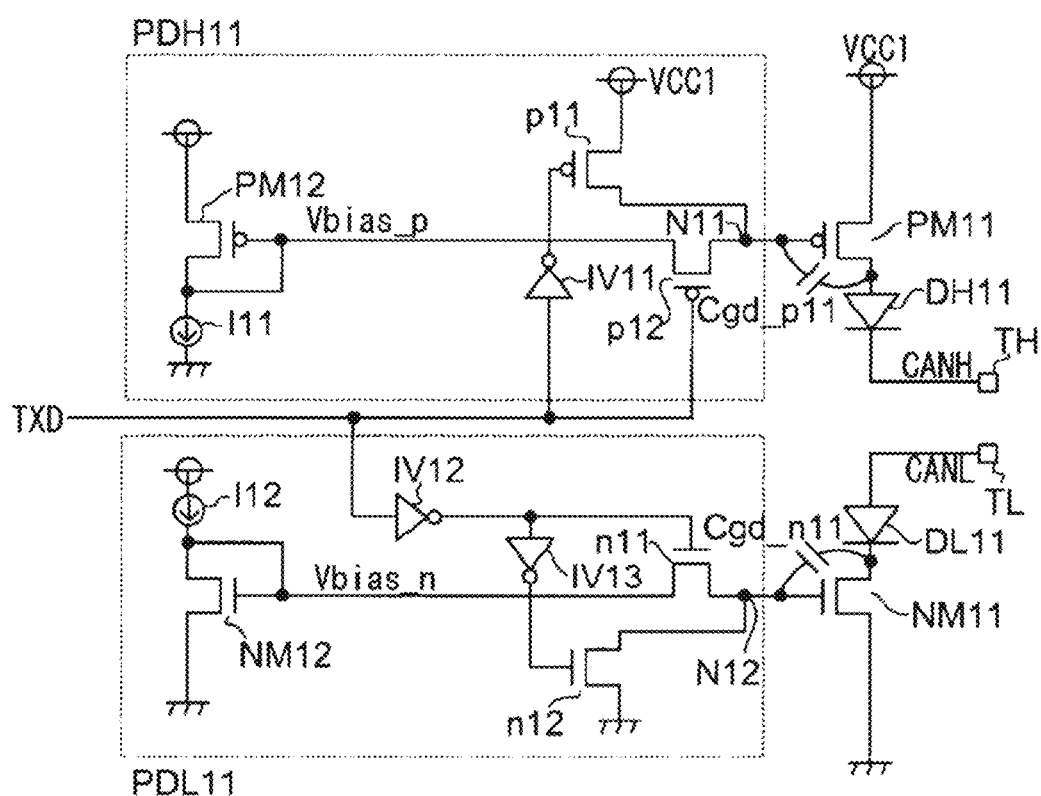
FIG. 6A is a circuit diagram illustrating a configuration of a differential signal transmission circuit according to a second comparative example.

Next, FIG. 6A is a circuit diagram illustrating a configuration of a differential signal transmission circuit 200 according to a second comparative example. As illustrated in FIG. 6A, the differential signal transmission circuit 200 includes a high-side transistor PM11 formed of a p-channel MOSFET, a low-side transistor NM11 formed of an n-channel MOSFET, a high-side diode DH11, a low-side diode DL11, a high-side pre-driver PDH11, a low-side pre-driver PDL11, a high-side output terminal TH, and a low-side output terminal TL. Although not shown in FIG. 6A, the resistors R21 and R22 and the load resistor RL are also connected to the high-side output terminal TH and the low-side output terminal TL, as in FIG. 2.

The high-side pre-driver PDH11 includes a transistor PM12 formed of a p-channel MOSFET, a constant current source I11, transistors p11 and p12 each formed of a p-channel MOSFET, and an inverter IV11. A drain and a gate of the transistor PM12 are short-circuited, and the gate of the transistor PM12 is connected to a gate of the high-side transistor PM11 via the transistor p12. A so-called current mirror circuit is configured by the transistor PM12 and the high-side transistor PM11.

An input signal TXD is input to a gate of the transistor p12. A source of the transistor p11 is connected to an application terminal of a first power supply voltage VCC1, and the drain of the transistor p11 is connected to a connection node N11 at which the transistor p12 and the high-side transistor PM11 are connected to each other. The input signal TXD is input to the gate of the transistor p11 via the inverter IV11.

The application terminal of the first power supply voltage VCC1 is connected to a source of the high-side transistor PM11, and an anode of the high-side diode DH11 is connected to a drain of the high-side transistor PM11. A cathode of the high-side diode DH11 is connected to the high-side output terminal TH.

The low-side pre-driver PDL11 includes a transistor NM12 formed of an n-channel MOSFET, a constant current source I12, transistors n11 and n12 each formed of an n-channel MOSFET, and inverters IV12 and IV13. A drain and a gate of the transistor NM12 are short-circuited, and the gate of the transistor NM12 is connected to a gate of the low-side transistor NM11 via the transistor n11. A so-called current mirror circuit is configured by the transistor NM12 and the low-side transistor NM11.

The input signal TXD is input to a gate of the transistor n11 via the inverter IV12. A source of the transistor n12 is connected to an application terminal of a ground potential, and a drain of the transistor n12 is connected to a connection node N12 at which the transistor n11 and the low-side transistor NM11 are connected to each other. The input signal TXD is input to a gate of the transistor n12 via the inverters IV12 and IV13.

The application terminal of the ground potential is connected to a source of the low-side transistor NM11, and a cathode of the low-side diode DL11 is connected to a drain of the low-side transistor NM11. An anode of the low-side diode DL11 is connected to the low-side output terminal TL.

With this configuration, when the input signal TXD is at a low level, the transistor p12 is turned on, the transistor p11 is turned off, and a bias voltage Vbias_p, which is a gate voltage of the transistor PM12, is applied to the gate of the high-side transistor PM11. Accordingly, the high-side transistor PM11 is turned on, and a current proportional to a current generated in the transistor PM12 flows through the high-side transistor PM11. Further, the transistor n11 is turned on, the transistor n12 is turned off, and the bias voltage Vbias_n, which is a gate voltage of the transistor NM12, is applied to the gate of the low-side transistor NM11. Accordingly, the low-side transistor NM11 is turned on, and a current proportional to a current generated in the transistor NM12 flows through the low-side transistor NM11.

In this case, similar to the first comparative example, the high-side signal CANH generated at the high-side output terminal TH becomes 3.5 V, and the low-side signal CANL generated at the low-side output terminal TL becomes 1.5 V.

On the other hand, when the input signal TXD is at a high level, the transistor p12 is turned off and the transistor p11 is turned on. Therefore, the first power supply voltage VCC1 is applied to the gate of the high-side transistor PM11 and the high-side transistor PM11 is turned off. Further, since the transistor n11 is turned off and the transistor n12 is turned on, the ground potential is applied to the gate of the low-side transistor NM11 and the low-side transistor NM11 is turned off.

In this case, similar to the first comparative example, both the high-side signal CANH generated at the high-side output terminal TH and the low-side signal CANL generated at the low-side output terminal TL become 2.5 V.

Also, in the second comparative example illustrated in FIG. 6A, the behavior of the high-side signal CANH and the low-side signal CANL is ideally as illustrated in FIG. 4, but unless the circuit constants are properly set, for example, the switching timings and the slew rates are deviated, which leads to the generation of EMI noise, as illustrated in FIG. 5.

Therefore, in the circuit illustrated in FIG. 6A, in order to match the switching timings and the slew rates between the high-side signal CANH and the low-side signal CANL, it is necessary to set the circuit constants that satisfy the conditions below in the circuit illustrated in FIG. 6A. However, it is assumed that the high-side transistor PM11 and the low-side transistor NM11 have substantially the same threshold voltage Vth of Vgs.

If the input signal TXD is at a low level:
$Ron\_p12 \cdot Cgd\_p11 \approx Ron\_n11 \cdot Cgd\_n11$ If the input signal TXD is at a high level:
$Ron\_p11 \cdot Cgd\_p11 \approx Ron\_n12 \cdot Cgd\_n11$  <Condition 2> where Ron_p11 is on-resistance of the transistor p11, Ron_p12 is on-resistance of the transistor p12, Ron_n11 is on-resistance of the transistor n11, Ron_n12 is on-resistance of the transistor n12, Cgd_p11 is gate-drain capacitance of the high-side transistor PM11, and Cgd_n11 is gate-drain capacitance of the low-side transistor NM11 (however, it is assumed that gm (=ΔId/ΔVgs)) of PM11 and NM11 having a Miller effect is substantially equal to each other).

However, the following problems exist in the first comparative example and the second comparative example described above. In general, the p-channel MOSFET and the n-channel MOSFET have different temperature characteristics of the on-resistance from each other (dRon_p/dT ≠ dRon_n/dT).

Further, variations of absolute values of the on-resistance of the p-channel MOSFET and the on-resistance of the n-channel MOSFET exist between processes (wafers).

Therefore, in the first comparative example (FIG. 3A) and the second comparative example (FIG. 6A), the conditions 1 and 2 described above are not satisfied due to the presence of the temperature characteristics and variations between processes as described above in the p-channel MOSFET and the n-channel MOSFET of the pre-drivers. Thus, the switching timings and the slew rates are deviated as described above, which results in the generation of EMI noise.

Further, there is a possibility that a surge of ±several tens of V may be input from the outside to the high-side output terminal TH and the low-side output terminal TL. In consideration of this, it is desirable to install a high breakdown voltage PMOS (p-channel MOSFET) 200P and a high breakdown voltage NMOS (n-channel MOSFET) 200N, as illustrated in FIG. 6B. In FIG. 6B, more specifically, a source of the PMOS 200P is connected to a cathode of the high-side diode DH11, a drain of the PMOS 200P is connected to the high-side output terminal TH, and the application terminal of the ground potential is connected to a gate of the PMOS 200P. By doing so, it is possible to clamp Vds (drain-source voltage) of the high-side transistor PM11 having a low breakdown voltage. In addition, a source of the NMOS 200N is connected to a drain of the low-side transistor NM11, a drain of the NMOS 200N is connected to a cathode of the low-side diode DL, and the application terminal of the power supply voltage is connected to a gate of the NMOS 200N. By doing so, it is possible to clamp Vds of the low-side transistor NM11 having a low breakdown voltage.

The configuration of FIG. 6A may be manufactured by using, for example, a bulk BiCDMOS process. In this case, since a leakage path by a parasitic diode PLD exists as illustrated in FIG. 6B, the cathode of the high-side diode DH11 cannot be directly connected to the high-side output terminal TH. Therefore, as illustrated in FIG. 6B, the cathode of the high-side diode DH11 is connected to the high-side output terminal TH via the PMOS 200P. Thus, as illustrated in FIG. 6B, the high side and the low side are asymmetrically configured. On the other hand, the configuration of FIG. 3A described above may be manufactured by using, for example, an SOI process. In this case, since the formation of the parasitic diode is suppressed, the cathode of the high-side diode DH can be directly connected to the high-side output terminal TH, as illustrated in FIG. 3B. Thus, the high side and the low side can be symmetrically configured.

The inventor of the present disclosure independently found such problems and devised embodiments of the present disclosure described below.

3. First Embodiment

Figure 7:
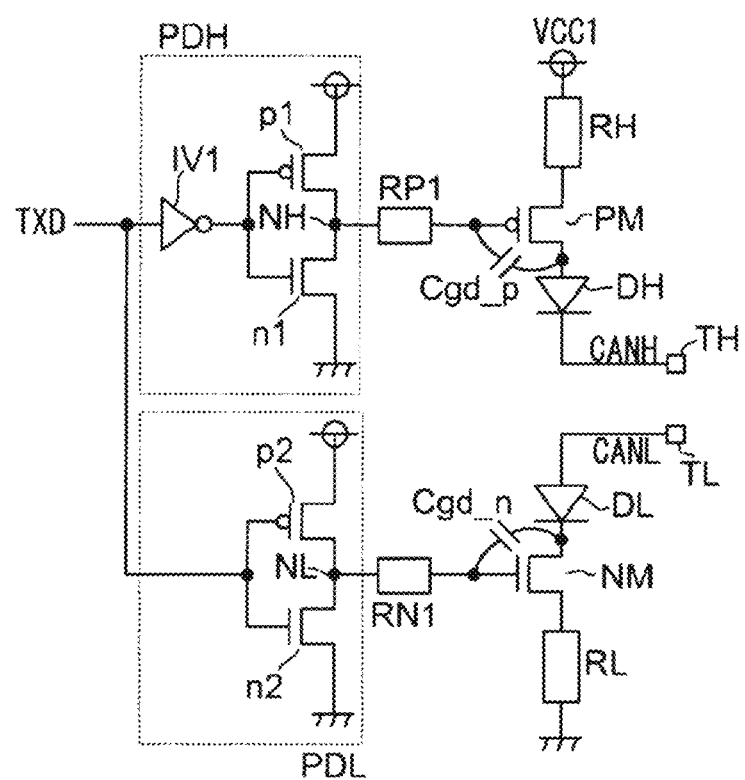
FIG. 7 is a circuit diagram illustrating a configuration of a differential signal transmission circuit according to a first embodiment of the present disclosure.

FIG. 7 is a circuit diagram illustrating a configuration of a differential signal transmission circuit 100A according to a first embodiment of the present disclosure. The configuration of the differential signal transmission circuit 100A illustrated in FIG. 7 is different from the configuration of the first comparative example (FIG. 3A) in that resistors RP1 and RN1 are added.

More specifically, the resistor RP1 is connected between a connection node NH, at which a drain of a high-side transistor p1 and a drain of a low-side transistor n1 in a high-side pre-driver PDH are connected to each other, and a gate of a high-side transistor PM. Further, the resistor RN1 is connected between a connection node NL, at which a drain of a high-side transistor p2 and a drain of a low-side transistor n2 in a low-side pre-driver PDL are connected to each other, and a gate of a low-side transistor NM.

The resistors RP1 and RN1 are devices having the same composition, and are formed of, for example, a polysilicon resistor. Further, in order to suppress deviation of the switching timings and the slew rates, the circuit constants are set to satisfy the conditions below.

$$RP1 \cdot Cgd\_p = RN1 \cdot Cgd\_n \qquad \text{<Condition 1A>}$$

If the resistors RP1 and RN2 are devices having the same composition, the temperature characteristics of resistance values become equal to each other, and the fluctuation in relative relationship between RP1 and RP2 of the on-resistance due to variations between processes is suppressed. Therefore, the condition 1A can be satisfied even by the temperature characteristics and the variations between processes. Thus, it is possible to suppress the deviation of the switching timings and the slew rates. This makes it possible to suppress the EMI noise under a wide range of conditions.

4. Second Embodiment

Figure 8:
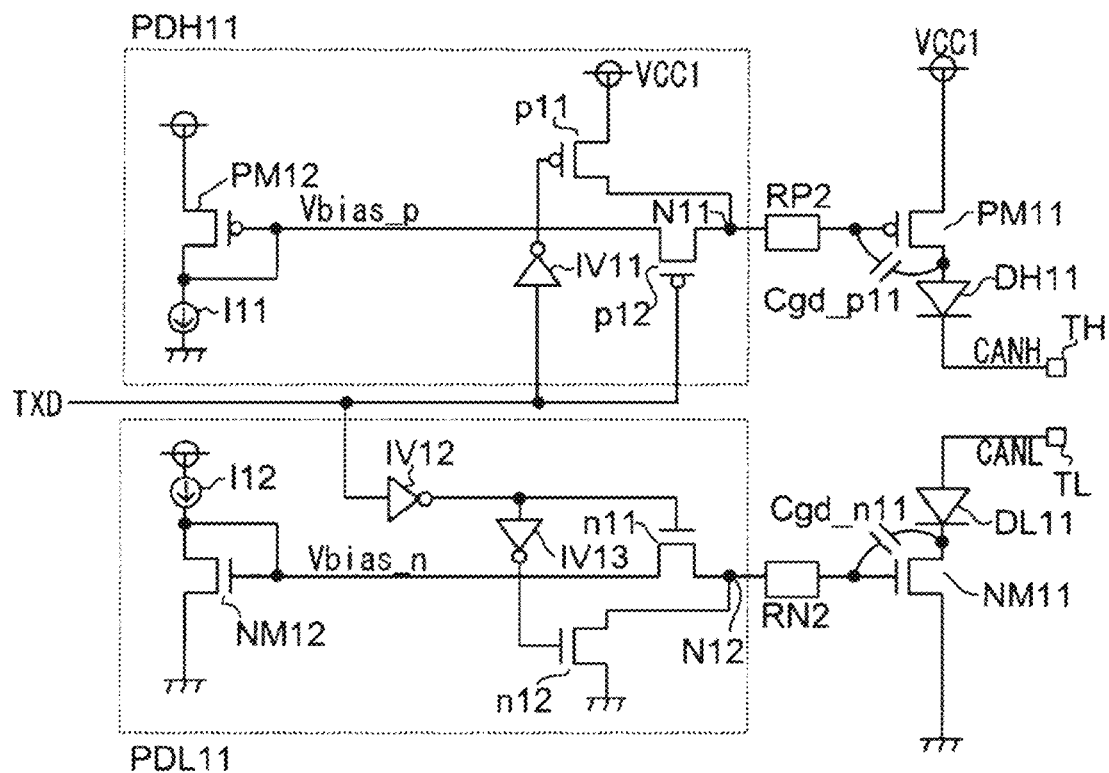
FIG. 8 is a circuit diagram illustrating a configuration of a differential signal transmission circuit according to a second embodiment of the present disclosure.

FIG. 8 is a circuit diagram illustrating a configuration of a differential signal transmission circuit 200A according to a second embodiment of the present disclosure. The configuration of the differential signal transmission circuit 200A illustrated in FIG. 8 is different from the configuration of the second comparative example (FIG. 6A) in that resistors RP2 and RN2 are added thereto.

More specifically, the resistor RP2 is connected between a connection node N11 and a gate of a high-side transistor PM11. The resistor RN2 is connected between a connection node N12 and a gate of a low-side transistor NM11.

The resistors RP2 and RN2 are devices having the same composition, and are formed of, for example, a polysilicon resistor. Furthermore, in order to suppress deviation of the switching timings and the slew rates, the circuit constants are set to satisfy the following conditions.

$$RP2 \cdot Cgd\_p11 = RN2 \cdot Cgd\_n11 \qquad \text{<Condition 2A>}$$

If the resistors RP2 and RN2 have the same composition, the temperature characteristics of resistance values become the same, and variation in relative relationship between RP2 and RN2 of the on-resistance due to variations between processes is suppressed. Therefore, the condition 2A can be satisfied even by the temperature characteristics and the variations between processes. Thus, it is possible to suppress the deviation of the switching timings and the slew rates. This makes it possible to suppress the EMI noise under a wide range of conditions.

5. Third Embodiment

Figure 9:
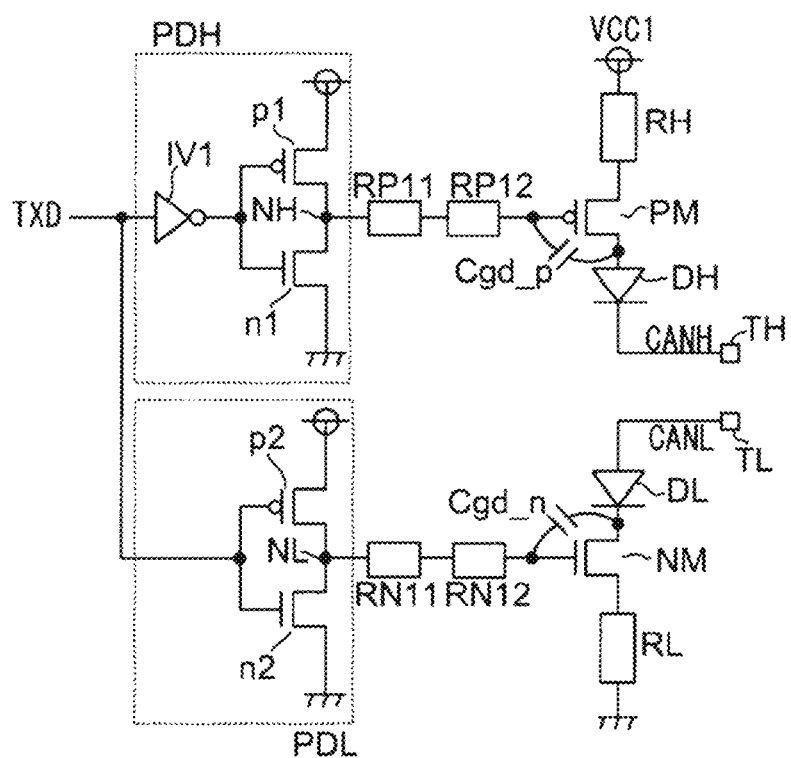
FIG. 9 is a circuit diagram illustrating a configuration of a differential signal transmission circuit according to a third embodiment of the present disclosure.

FIG. 9 is a circuit diagram illustrating a configuration of a differential signal transmission circuit 100B according to a third embodiment of the present disclosure. The configuration of the differential signal transmission circuit 100B illustrated in FIG. 9 is different from the configuration of the first embodiment (FIG. 7) in that resistors RP11, RP12, RN11, and RN12 are added thereto.

More specifically, the resistors RP11 and RP12 are connected in series between a connection node NH and a gate of a high-side transistor PM. The resistors RN11 and RN12 are connected in series between the connection node NL and a gate of a low-side transistor NM.

In this case, the resistors RP11 and RN11 are formed of, for example, a polysilicon resistor or the like, and have negative temperature characteristics for resistance values. On the other hand, the resistors RP12 and RN12 are formed of, for example, a metal resistor or the like, and have positive temperature characteristics for resistance values.

Further, in order to suppress deviation of the switching timings and the slew rates, the circuit constants are set to satisfy the following conditions.

$(RP11+RP12) \cdot Cgd\_p = (RN11+RN12) \cdot Cgd\_n$ <Condition 1B>

Accordingly, the condition 1B can be satisfied by cancelling the temperature characteristics in each of a set of resistors RP11 and RP12 and a set of resistors RN11 and RN12, and suppressing variations of the value of (RP11+RP12) and the value of (RN11+RN12) with respect to the temperature change.

6. Fourth Embodiment

Figure 10:
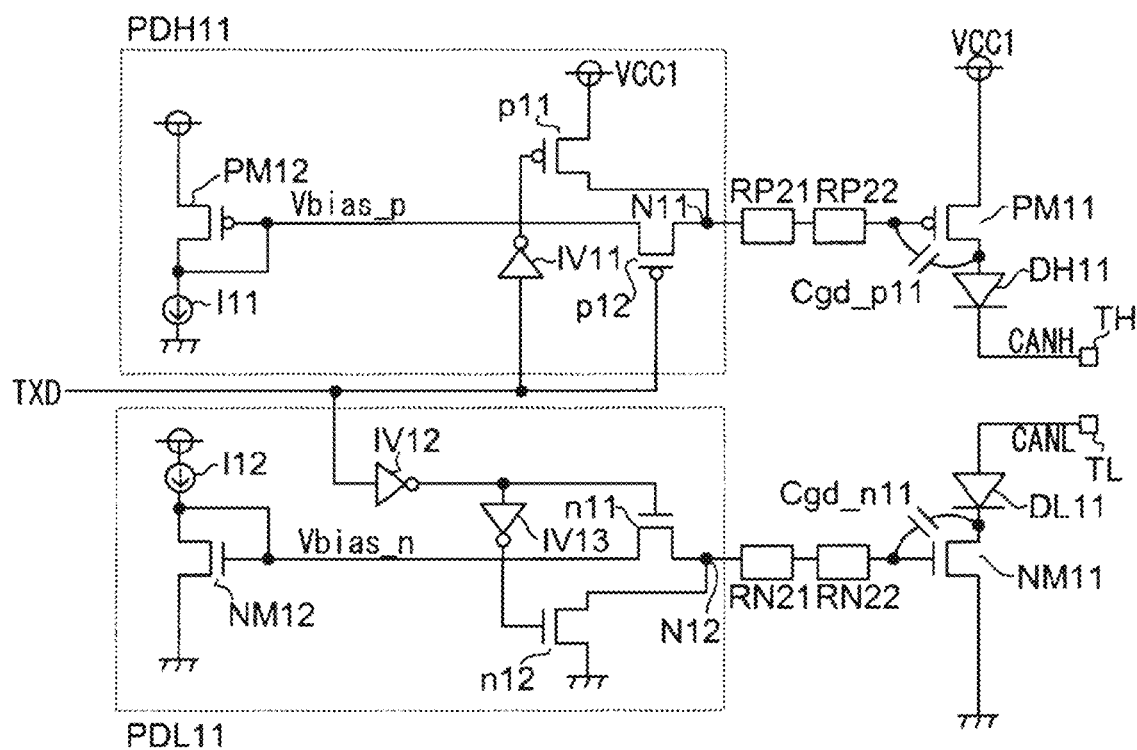
FIG. 10 is a circuit diagram illustrating a configuration of a differential signal transmission circuit according to a fourth embodiment of the present disclosure.

FIG. 10 is a circuit diagram illustrating a configuration of a differential signal transmission circuit 200B according to a fourth embodiment of the present disclosure. The configuration of the differential signal transmission circuit 200B illustrated in FIG. 10 is different from the configuration of the second embodiment (FIG. 8) in that resistors RP21, RP22, RN21, and RN22 are included therein.

More specifically, the resistor RP21 and the resistor RP22 are connected in series between a connection node N11 and a gate of a high-side transistor PM11. Further, the resistors RN21 and RN22 are connected in series between a connection node N12 and a gate of a low-side transistor NM11.

In this case, the resistors RP21 and RN21 are formed of, for example, a polysilicon resistor or the like, and have negative temperature characteristics for resistance values. On the other hand, the resistors RP22 and RN22 are formed of, for example, a metal resistor or the like, and have positive temperature characteristics for resistance values.

Further, in order to suppress deviation of the switching timings and the slew rates, the circuit constants are set to satisfy the following conditions.

$(RP21+RP22) \cdot Cgd\_p11 = (RN21+RN22) \cdot Cgd\_n11$ <Condition 2B>

Accordingly, the condition 2B can be satisfied by cancelling the temperature characteristics in each of a set of resistors RP21 and RP22 and a set of resistors RN21 and RN22, and suppressing variations of the value of (RP21+RP22) and the value of (RN21+RN22) with respect to the temperature change.

7. Fifth Embodiment

Figure 11:
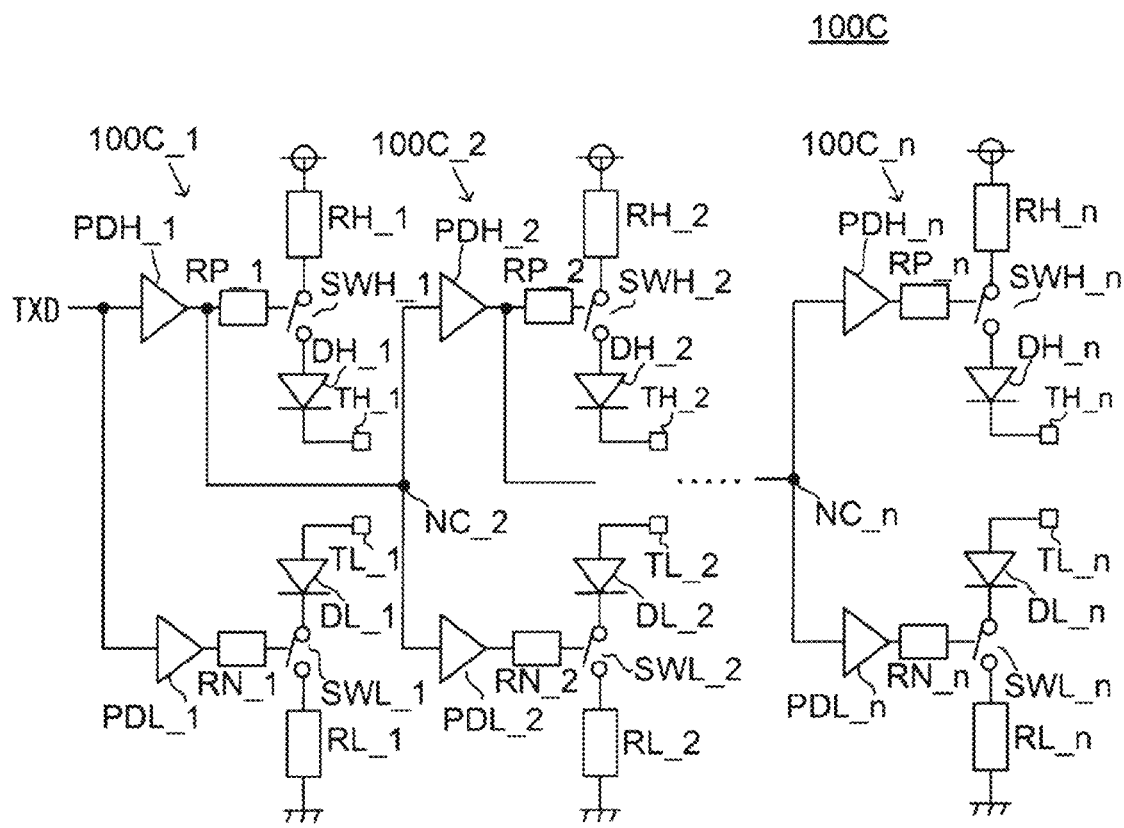
FIG. 11 is a circuit diagram illustrating a configuration of a differential signal transmission circuit according to a fifth embodiment of the present disclosure.

Next, a fifth embodiment of the present disclosure will be described. FIG. 11 is a circuit diagram illustrating a configuration of a differential signal transmission circuit 100C according to the fifth embodiment of the present disclosure. The differential signal transmission circuit 100C illustrated in FIG. 11 has a multi-stage configuration by sequentially connecting the differential signal transmission circuit 100A of the first embodiment from a front stage.

As illustrated in FIG. 11, the differential signal transmission circuit 100C is configured by sequentially connecting a first stage 100C_1 to an n-th stage 100C_n, where n is the number of stages and is an integer of 2 or more (for example, n=10).

Each circuit from the first stage 100C_1 to the nth stage 100C_n is configured in the same manner as the differential signal transmission circuit 100A (FIG. 7) according to the first embodiment described above. However, in FIG. 11, the illustration of the pre-drivers PDH and PDL is simplified, the high-side transistor PM (FIG. 7) which is a p-channel MOSFET is represented as a high-side switch SWH, and the low-side transistor NM (FIG. 7) which is an re-channel MOSFET is represented as a low-side switch SWL. Furthermore, in FIG. 11, 1 to n which can be attached to each reference numeral indicate each stage.

An input signal TDX is input to the first stage 100C_1. An output end of the high-side pre-driver PDH_1 in the first stage 100C_1 is connected to a connection node NC_2 at which an input end of a high-side pre-driver PDH_2 and an input end of a low-side pre-driver PDL_2 in the second stage 100C_2 are connected to each other. An output end of a high-side pre-driver PDH_2 in the second stage 100C_2 is connected to a connection node at which an input end of a high-side pre-driver and an input end of a low-side pre-driver in the third stage are connected to each other. Subsequently, in a similar manner, adjacent stages are sequentially connected to a connection node NC_n.

With this configuration, when the input signal TDX becomes a low level, the high-side pre-drivers PDH_1 to PDH_n sequentially output low levels and high-side switches SWH_1 to SWH_n are sequentially turned on. At this time, the low-side pre-drivers PDL_1 to PDL_n sequentially output high levels, and the low-side switches SWL_1 to SWL_n are sequentially turned on.

In this case, high-side output terminals TH_1 to TH_n are commonly connected, and a high-side signal CANH is generated at these terminals. Furthermore, low-side output terminals TL_1 to TL_n are commonly connected, and a low-side signal CANL is generated at these terminals. FIG. 12B illustrates temporal behavior of the high-side signal CANH, the low-side signal CANL, and a sum of these signals in the multistage configuration as in the present embodiment.

As illustrated in FIG. 12B, each time the high-side switches SWH_1 to SWH_n are sequentially turned on from the front stage side, high-side resistors RH_1 to RH_n are sequentially connected in parallel from the front stage side, and a gradual rise of the high-side signal CANH is repeated. On the other hand, each time the low-side switches SWL_1 to SWL_n are sequentially turned on from the front stage side, the low-side resistors RL_1 to RL_n are sequentially connected in parallel from the front stage side, and a gradual drop of the low-side signal CANH is repeated.

Figure 12A:
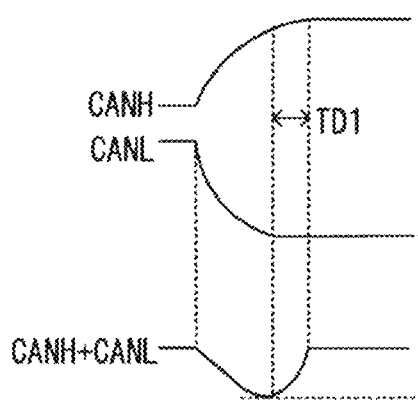
FIG. 12A is a timing chart illustrating an example of behavior of a high-side signal CANH, a low-side signal CANL, and a sum thereof in a single-stage configuration.
Figure 12B:
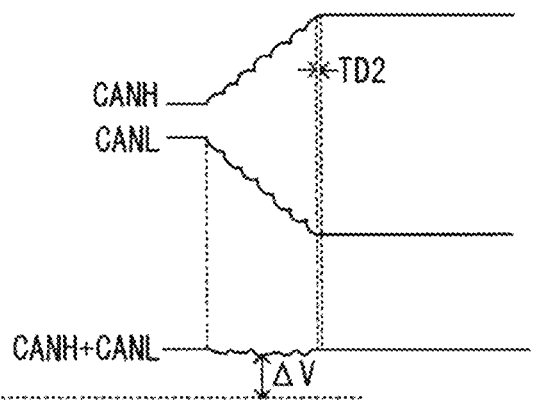
FIG. 12B is a timing chart illustrating an example of behavior of a high-side signal CANH, a low-side signal CANL, and a sum thereof in a multi-stage configuration.

Here, FIG. 12A illustrates temporal behavior of each signal when the differential signal transmission circuit is configured in a single stage. In the case of the single-stage configuration, as illustrated in FIG. 12A, a delay time TD1 due to deviation of the slew rates of the high-side signal CANH and the low-side signal CANL becomes large. However, in case of multi-stage configuration, as illustrated in FIG. 12B, a delay time TD2 due to deviation of the slew rates by the rise of the high-side signal CANH and the drop of the low-side signal CANL per one time becomes significantly smaller than the delay time TD1. Furthermore, in case of the multi-stage configuration as in FIG. 11, since the deviation of the slew rates can be further suppressed by adjusting the resistance values of the resistors RP_1 to RP_n and the resistors RN_1 to RN_n, the delay time TD2 can be further suppressed.

Accordingly, as illustrated in FIGS. 12A and 12B, the sum of the high-side signal CANH and the low-side signal CANL can reduce voltage fluctuation in the multi-stage configuration more than in the single-stage configuration (ΔV in FIG. 12B). Therefore, the EMI noise level of low frequency can be suppressed by the multi-stage configuration. However, it becomes easy for the EMI noise level of high frequency to increase as a trade-off.

Figure 13:
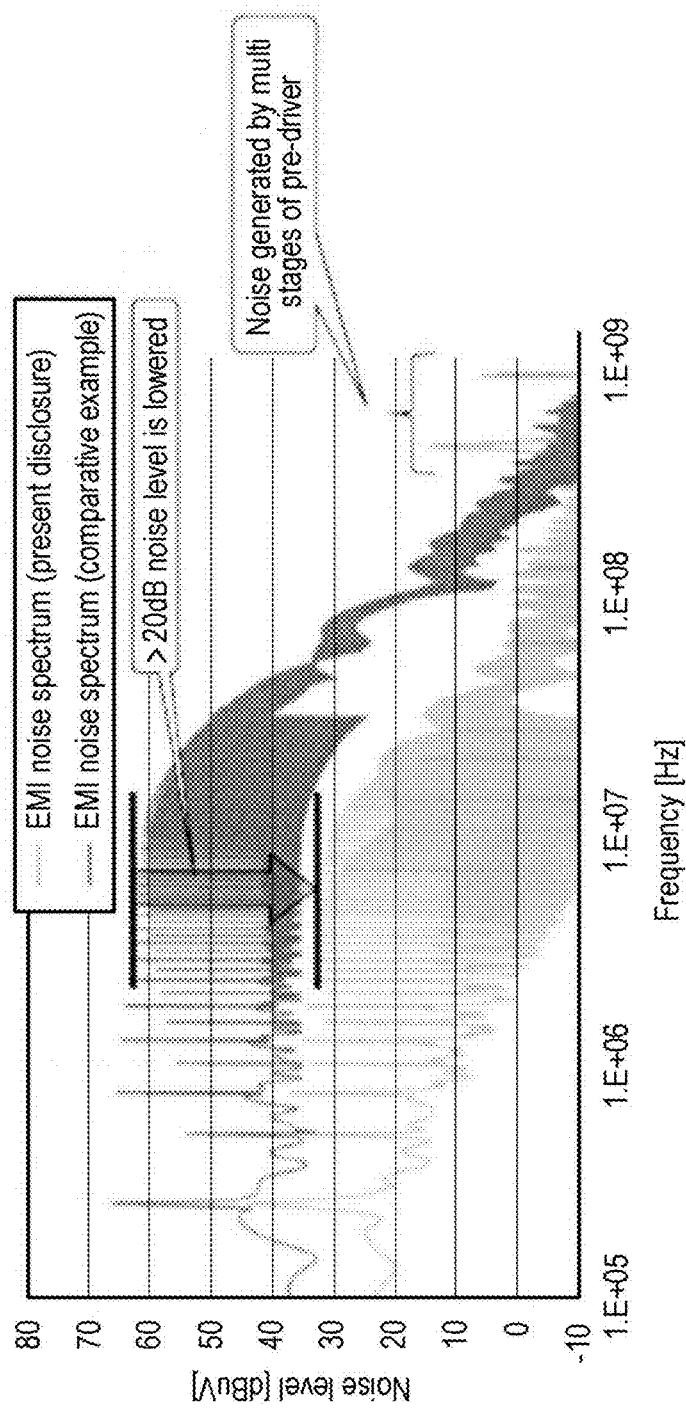
FIG. 13 is a graph illustrating an example of an EMI noise spectrum.

FIG. 13 illustrates an example of spectrum of EMI noise in case of the differential signal transmission circuit 100 (FIG. 3A) according to the first comparative example which has a single-stage configuration, and spectrum of EMI noise in case of the differential signal transmission circuit 100C (FIG. 11) according to the present embodiment which has a multi-stage configuration. As illustrated in FIG. 13, the noise level of low frequency is suppressed by providing multiple stages and installing the resistors RP_1 to RP_n and the resistors RN_1 to RN_n. However, the noise level is partially increased at a high frequency.

Further, when the stages are sequentially connected in the multi-stage configuration, the output end of the low-side pre-driver PDL may be connected to each input end of the high-side pre-driver PDH and the low-side pre-driver PDL of the rear stage.

In addition, a multi-stage configuration may also be adopted for the configuration according to the third embodiment described above (FIG. 9).

8. Sixth Embodiment

Figure 14:
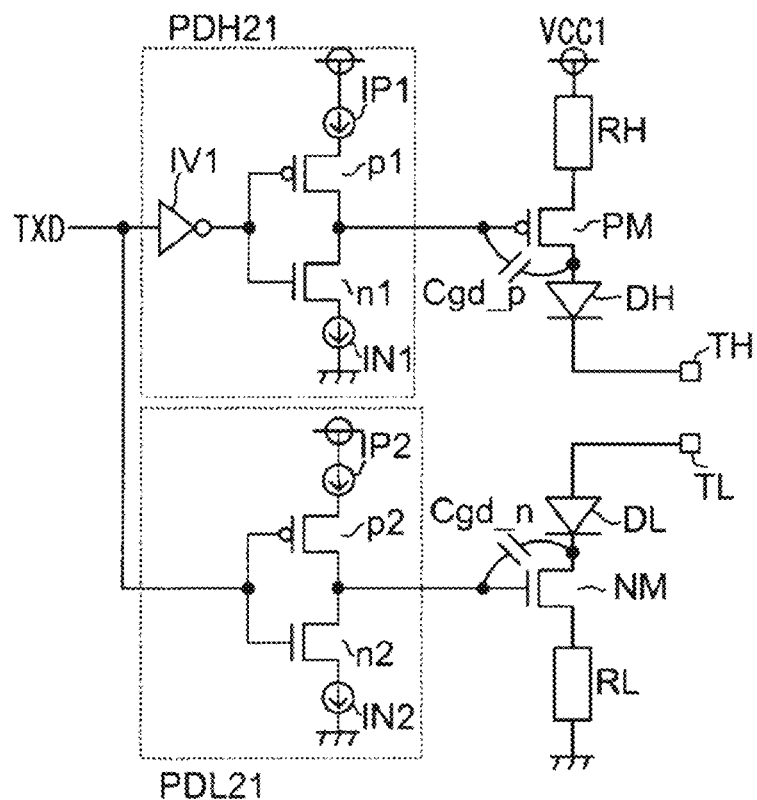
FIG. 14 is a circuit diagram illustrating a configuration of a differential signal transmission circuit according to a sixth embodiment of the present disclosure.

Next, a sixth embodiment of the present disclosure will be described. FIG. 14 is a circuit diagram illustrating a configuration of a differential signal transmission circuit 100D according to the sixth embodiment of the present disclosure. A difference between the configuration of the differential signal transmission circuit 100D illustrated in FIG. 14 and the configuration of the first comparative example (FIG. 3A) is a high-side pre-driver PDH21 and a low-side pre-driver PDL21.

The high-side pre-driver PDH21 includes constant current sources IP1 and IN1, in addition to the configuration of the high-side pre-driver PDH illustrated in FIG. 3A. The constant current source IP1 is arranged more on the power source side than the source of the high-side transistor p1, and the constant current source IN1 is arranged more on the ground side than the source of the low-side transistor n1.

The low-side pre-driver PDL21 includes constant current sources IP2 and IN2, in addition to the configuration of the low-side pre-driver PDL illustrated in FIG. 3A. The constant current source IP2 is arranged more on the power source side than the source of the high-side transistor p2, and the constant current source IN2 is arranged more on the ground side than the source of the low-side transistor n2.

In this case, in the present embodiment, in order to match the slew rates of the high-side signal CANH and the low-side signal CANL, the circuit constants are set to satisfy the conditions below.

If the input signal TXD is at a low level: $IN1 \cdot (1/Cgd\_p) IP2 \cdot (1/Cgd\_n)$ If the input signal TXD is at a high level: $IP1 \cdot (1/Cgd\_p) IN2 \cdot (1/Cgd\_n)$ <Condition 1C> where IN1, IP1, IN2, and IP2 are current values of the respective constant current sources.

Even with this configuration, EMI noise can be suppressed under a wide range of conditions. In particular, in the present embodiment, since the constant current sources are used, the slew rates can be controlled with high accuracy. However, the first and second embodiments described above are more advantageous in circuit scale.

9. Seventh Embodiment

Figure 15:
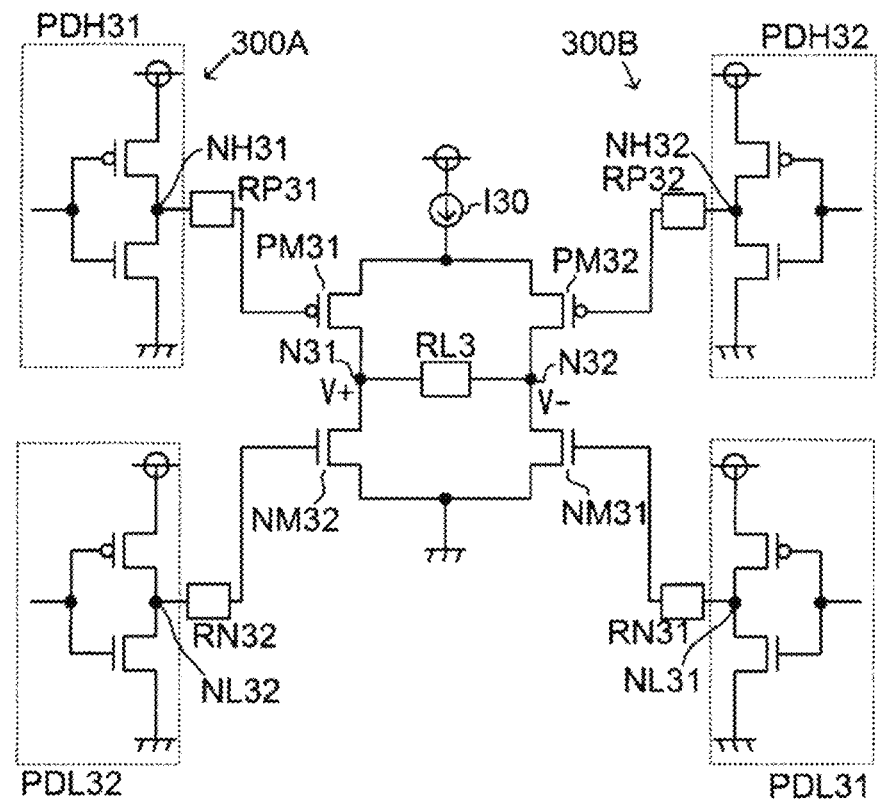
FIG. 15 is a circuit diagram illustrating a configuration of an LVDS system according to a seventh embodiment of the present disclosure.

Next, a seventh embodiment according to an example in which the present disclosure is applied to low voltage differential signaling (LVDS) will be described. FIG. 15 is a circuit diagram illustrating a configuration of an LVDS system 300 according to the seventh embodiment of the present disclosure.

The LVDS system 300 includes a first differential signal transmission circuit 300A and a second differential signal transmission circuit 300B.

The first differential signal transmission circuit 300A includes a high-side transistor PM31 formed of a p-channel MOSFET, a resistor RP31, a high-side pre-driver PDH31, a low-side transistor NM31 formed of an n-channel MOSFET, a resistor RN31, and a low-side pre-driver PDL31.

The second differential signal transmission circuit 300B includes a high-side transistor PM32 formed of a p-channel MOSFET, a resistor RP32, a high-side pre-driver PDH32, a low-side transistor NM32 formed of an n-channel MOSFET, a resistor RN32, and a low-side pre-driver PDL 32.

A source of the high-side transistor PM31 and a source of the high-side transistor PM32 are commonly connected to an application terminal of a power supply voltage via a constant current source 130. A source of the low-side transistor NM32 and a source of the low-side transistor NM31 are commonly connected to an application terminal of a ground potential. A load resistor RL3 is connected between a connection node N31, to which a drain of the high-side transistor PM31 and a drain of the low-side transistor NM32 are connected, and a connection node N32, to which a drain of the high-side transistor PM32 and a drain of the low-side transistor NM31 are connected.

Figure 16:
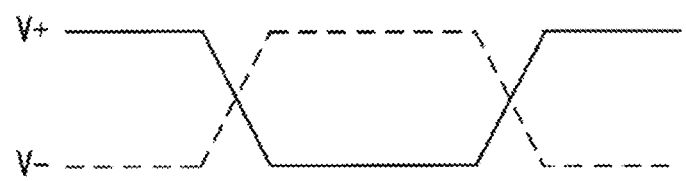
FIG. 16 is a timing chart illustrating an example of behavior of a positive side signal V+ and a negative side signal V− in the LVDS system.

A differential signal is generated as a differential voltage between a positive side signal V+ generated at the connection node N31 and a negative side signal V− generated at the connection node N32. When the high-side transistor PM31 and the low-side transistor NM31 are turned on and the high-side transistor PM32 and the low-side transistor NM32 are turned off, a constant current flows through the load resistor RL3, and the positive side signal V+ becomes higher than the negative side signal V−. On the other hand, when the high-side transistor PM31 and the low-side transistor NM31 are turned off and the high-side transistor PM32 and the low-side transistor NM32 are turned on, a constant current flows through the load resistor RL3, and the positive-side signal V+ becomes lower than the negative-side signal V−. When these transistors are repeatedly turned on and off, the positive-side signal V+ and the negative-side signal V− have waveforms as illustrated in FIG. 16.

In such a configuration, in order to match the slew rates of the positive side signal V+ and the negative side signal V−, the circuit constants are set to satisfy the conditions below. Further, the resistors RP31 and RN31 are configured by devices having the same composition, and the resistors RP32 and RN32 are configured by devices having the same composition.

$RP31 \cdot Cgd\_p31 \approx RN31 \cdot Cgd\_n31$ <Conditions of the Differential Signal Transmission Circuit 300A> where Cgd_p31 is gate-drain capacitance of the high-side transistor PM31, and Cgd_n31 is gate-drain capacitance of the low-side transistor NM31.

$RP32 \cdot Cgd\_p32 \approx RN32 \cdot Cgd\_n32$ <Conditions of the Differential Signal Transmission Circuit 300B> where Cgd_p32 is gate-drain capacitance of the high-side transistor PM32, and Cgd_n32 is gate-drain capacitance of the low-side transistor NM32.

According to this embodiment, in the LVDS system 300, the sum of the positive side signal V+ and the negative side signal V− can be made constant, thereby suppressing the EMI noise level. In particular, it is possible to suppress the generation of EMI noise due to the temperature characteristics of resistance values and the variations between processes.

10. Others

The embodiments of the present disclosure have been described above, but the embodiments may be variously modified within the scope of the spirit of the present disclosure. For example, the aforementioned embodiments may be appropriately combined and implemented to the extent no contradiction occurs.

The present disclosure can be used in, for example, an in-vehicle network or the like.

According to the present disclosure in some embodiments, it is possible to provide a differential signal transmission circuit capable of suppressing generation of EMI noise.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A differential signal transmission circuit, comprising:
a first output terminal;
a second output terminal connected to the first output terminal via a load resistor;
a high-side transistor formed of a p-channel MOSFET and connected between an application terminal of a power supply voltage and the first output terminal;
a low-side transistor formed of an n-channel MOSFET and connected between an application terminal of a ground potential and the second output terminal;
a high-side pre-driver configured to drive the high-side transistor;
a low-side pre-driver configured to drive the low-side transistor;
a first resistance part connected between an output end of the high-side pre-driver and a gate of the high-side transistor;
a second resistance part connected between an output end of the low-side pre-driver and a gate of the low-side transistor;
a high-side diode having an anode connected to a drain of the high-side transistor and a cathode directly connected to the first output terminal;
a low-side diode having a cathode connected to a drain of the low-side transistor and an anode directly connected to the second output terminal;
a high-side resistor having one end connected only to the application terminal of the power supply voltage and another end connected only to a source of the high-side transistor; and
a low-side resistor having one end connected only to the application terminal of the ground potential and another end connected only to a source of the low-side transistor.

2. The differential signal transmission circuit of claim 1, wherein the first resistance part and the second resistance part are devices having a same composition.

3. The differential signal transmission circuit of claim 2, wherein the first resistance part and the second resistance part are polysilicon resistors.

4. The differential signal transmission circuit of claim 1, wherein each of the first resistance part and the second resistance part has a configuration in which a resistor having a negative temperature characteristic for resistance values and a resistor having a positive temperature characteristic for the resistance values are connected in series.

5. The differential signal transmission circuit of claim 1, wherein following conditions are satisfied:

$$RP \cdot Cgd\_p \approx RN \cdot Cgd\_n$$

where RP is a resistance value of the first resistance part, RN is a resistance value of the second resistance part, $Cgd\_p$ is gate-drain capacitance of the high-side transistor, and $Cgd\_n$ is gate-drain capacitance of the low-side transistor.

6. A controller area network (CAN) transceiver comprising the differential signal transmission circuit of claim 1.

7. A low voltage differential signaling (LVDS) system comprising the differential signal transmission circuit of claim 1.

* * * * *